(12) United States Patent
Tsen et al.

(10) Patent No.: US 8,219,341 B2
(45) Date of Patent: Jul. 10, 2012

(54) SYSTEM AND METHOD FOR IMPLEMENTING WAFER ACCEPTANCE TEST ("WAT") ADVANCED PROCESS CONTROL ("APC") WITH ROUTING MODEL

(75) Inventors: Andy Tsen, Chung-Ho (TW); Sunny Wu, Hsinchu County (TW); Wang Jo Fei, Hsinchu (TW); Jong-I Mou, Hsinpu Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 351 days.

(21) Appl. No.: 12/411,680

(22) Filed: Mar. 26, 2009

(65) Prior Publication Data

US 2010/0250172 A1 Sep. 30, 2010

(51) Int. Cl.
*G06F 19/00* (2006.01)

(52) U.S. Cl. ........... 702/82; 702/81; 702/83; 702/84; 702/179; 702/181; 702/182; 702/183; 702/184; 702/185; 438/5; 438/10; 438/11; 438/17; 703/14; 324/765; 324/759; 324/158.1

(58) Field of Classification Search .............. 702/81–84, 702/179, 181–185; 438/5, 10, 11, 17; 703/14; 324/765, 759, 158.1
See application file for complete search history.

(56) References Cited

U.S. PATENT DOCUMENTS

| | | | |
|---|---|---|---|
| 6,929,962 B1 | 8/2005 | Chang | |
| 7,292,959 B1 * | 11/2007 | Markle et al. | 702/182 |
| 2009/0157216 A1 * | 6/2009 | Krishnaswamy et al. | 700/121 |
| 2009/0171493 A1 * | 7/2009 | Govind et al. | 700/103 |

* cited by examiner

*Primary Examiner* — Sujoy Kundu
(74) *Attorney, Agent, or Firm* — Haynes and Boone, LLP

(57) ABSTRACT

System and method for implementing wafer acceptance test ("WAT") advanced process control ("APC") are described. In one embodiment, the method comprises performing an inter-metal ("IM") WAT on a plurality of processed wafer lots; selecting a subset of the plurality of wafer lots using a lot sampling process; and selecting a sample wafer group using the wafer lot subset, wherein IM WAT is performed on wafers of the sample wafer group to obtain IM WAT data therefore. The method further comprises estimating final WAT data for all wafers in the processed wafer lots from IM WAT data obtained for the sample wafer group and providing the estimated final WAT data to a WAT APC process for controlling processes.

14 Claims, 11 Drawing Sheets

FIG. 4B

| Table-1 | | Suffix Group-1 | | | | | | | Suffix Group-2 | | | | | | | | B | C | D |
|---|---|---|---|---|---|---|---|---|---|---|---|---|---|---|---|---|---|---|---|
| Stage | Tool | L1 | L2 | L3 | L4 | L5 | L6 | L7 | L8 | L9 | L10 | L11 | L12 | L13 | L14 | L15 | Weekly Total Lot Count | Last Week Not Covered Lot Count | To Be Sampled Lot Count |
| Stage-1 | Tool-1 | 1 | | | | | | | | | | | | | | | 4 | 7 | 0 |
| | Tool-2 | | 1 | | | 1 | 1 | 1 | 1 | | | | | | | | 10 | 0 | 0 |
| | Tool-3 | | | 1 | | | | | | | | | | | | | 1 | 0 | 0 |
| | Tool-4 | 1 | 1 | | | | | | | | | | | | | | 2 | 1 | 0 |
| Stage-2 | Tool-5 | | | | 1 | 1 | | | 1 | | 1 | | | | | | 4 | 0 | 0 |
| | Tool-6 | | | | | | 1 | | | | | | | | | | 1 | 0 | 0 |
| | Tool-7 | | | | 1 | | | 1 | | 1 | 1 | 1 | 1 | 1 | | | 7 | 2 | 0 |
| | Tool-8 | | | | | | | | 1 | 1 | | | | | 1 | | 3 | 0 | 0 |
| Stage-N | Tool-N | 1 | | 1 | 1 | 1 | 1 | | | 1 | | 1 | | | 1 | 1 | 6 | 4 | 0 |
| | Tool-N+1 | | 1 | | | 1 | 1 | 1 | 1 | 1 | 1 | 1 | 1 | 1 | 1 | 1 | 9 | 0 | 0 |
| Cycle-1 Score | | 20 | 22 | 13 | 24 | 20 | 24 | 21 | 24 | 22 | 24 | 24 | 24 | 24 | 21 | 24 | 24 | =Sum of [A*(B+C)*(1-D)] | |

| Table-2 | | | | | | | | | | | | | | | B | C | D |
|---|---|---|---|---|---|---|---|---|---|---|---|---|---|---|---|---|---|
| | | | Suffix Group-1 | | | | | | Suffix Group-2 | | | | | | Weekly Total Lot Count | Last Week Not Covered Lot Count | To Be Sampled Lot Count |
| Stage | Tool | L1 | L2 | L3 | L5 | L7 | L8 | L9 | L10 | L11 | L12 | L13 | L15 | | | | |
| Stage-1 | Tool-1 | 1 | | | | | | | | | | | | | 4 | 7 | 1 |
| | Tool-2 | | 1 | | | 1 | 1 | | | | | | | | 10 | 0 | 1 |
| | Tool-3 | | | 1 | | | | | | | | | | | 1 | 0 | 1 |
| Stage-2 | Tool-4 | 1 | 1 | | | | | | | | | | | | 2 | 1 | 1 |
| | Tool-5 | | | 1 | 1 | | | | | 1 | | | | | 4 | 0 | 1 |
| | Tool-6 | | | | | 1 | | | | | | | | | 1 | 0 | 1 |
| | Tool-7 | | | | | | 1 | 1 | 1 | | | 1 | 1 | | 7 | 2 | 1 |
| | Tool-8 | | | | | | | | | | 1 | | | | 3 | 0 | 1 |
| Stage-N | Tool-N | 1 | | | | | | | | | | | | | 6 | 4 | 1 |
| | Tool-N+1 | | 1 | 1 | 1 | 1 | 1 | 1 | 1 | 1 | 1 | 1 | 1 | | 9 | 0 | 1 |
| Cycle-2 Score | | 0.58 | 0.54 | 1.35 | 0.50 | 1.20 | 0.41 | 0.41 | 0.44 | 0.41 | 0.45 | 0.41 | 0.41 | | =Sum of [A*D/(B+C)] | | |

FIG. 4C $$\text{Lot\_Mean\_Error} = \left| \frac{\text{3pcs\_WAT\_Mean}_{\text{Lot}(i)} - \text{25pcs\_WAT\_Mean}_{\text{Lot}(i)}}{\text{25pcs\_WAT\_Mean}_{\text{Lot}(i)}} \right|$$ ⟵ 550

$$\text{STD\_Error} = \left| \frac{\text{3pcs\_WAT\_STD}_{\text{All\_Lot}} - \text{25pcs\_WAT\_STD}_{\text{All\_Lot}}}{\text{25pcs\_WAT\_STD}_{\text{All\_Lot}}} \right|$$ ⟵ 552

$$\text{Infex}_x = w_1 \times \frac{A_x - A_a}{A_s} + w_2 \times \frac{B_x - B_a}{B_s} + w_3 \times \frac{C_x - C_a}{C_s} + w_4 \times \frac{D_x - D_a}{D_s}$$ ⟵ 554

FIG. 5B

| Month | 3pcs Wafer ID | P4 Mean_Error | P4 STD_Error | N4 Mean_Error | N4 STD_Error | Overall Index | Remark |
|---|---|---|---|---|---|---|---|
| May | [6][13][18] | 0.63% | 1.8% | 0.70% | 1.0% | -2.71 | Current |
| | [6][11][22] | 0.59% | 0.27% | 0.75% | 4.24% | -2.33 | June Best |
| | [6][7][23] | 0.60% | 0.3% | 0.65% | 2.7% | -4.77 | Robust |
| June | [6][13][18] | 0.63% | 3.8% | 0.75% | 4.1% | -0.36 | Current |
| | [6][11][22] | 0.55% | 0.49% | 0.57% | 1.97% | -6.13 | June Best |
| | [6][7][23] | 0.59% | 1.7% | 0.64% | 2.0% | -3.97 | Robust |
| July | [6][13][18] | 0.68% | 0.4% | 0.73% | 5.4% | -1.31 | Current |
| | [6][11][22] | 0.62% | 2.55% | 0.73% | 4.46% | -0.94 | June Best |
| | [6][7][23] | 0.53% | 2.5% | 0.71% | 0.5% | -3.37 | Robust |

SYSTEM AND METHOD FOR IMPLEMENTING WAFER ACCEPTANCE TEST ("WAT") ADVANCED PROCESS CONTROL ("APC") WITH ROUTING MODEL

BACKGROUND

The present disclosure relates generally to Advanced Process Control ("APC") as applied to semiconductor fabrication and, more particularly, to system and method for implementing a wafer acceptance test ("WAT") APC with routing model.

APC has become an essential component in semiconductor fabrication facilities ("fabs") for enabling continued improvement of device yield and reliability at a reduced cost. Significant elements of APC include integrated metrology, fault detection and classification, and run-to-run control. APC aids in reducing process variation as well as production costs. A key requirement for effective APC is that metrology tools are available to measure key parameters within an acceptable time frame. Additionally, methods must be provided for analyzing and interpreting measurement data. In practice, APC requires rich in-line measurements because the manufacturing processes are usually subjected to disturbance and drift caused by a variety of sources.

Similarly, wafer-level testing plays a crucial role in IC fabrication, particularly as the cost for post production processes increases. A defective wafer is identified by the processing and disposed of before it undergoes post-processing. A wafer acceptance test ("WAT") includes numerous testing items and is a vital part of the IC fabrication process. In a conventional foundry, WAT is performed as defined by a predetermined WAT model that specifies a number of test sites for wafers of a particular size. As advances have been made in IC fabrication, more specific testing has been required to determine product quality.

SUMMARY

System and method for implementing wafer acceptance test ("WAT") advanced process control ("APC") are described. In one embodiment, the method comprises performing an inter-metal ("IM") WAT on a plurality of processed wafer lots; selecting a subset of the plurality of wafer lots using a lot sampling process; and selecting a sample wafer group using the wafer lot subset, wherein IM WAT is performed on wafers of the sample wafer group to obtain IM WAT data therefore. The method further comprises estimating final WAT data for all wafers in the processed wafer lots from IM WAT data obtained for the sample wafer group and providing the estimated final WAT data to a WAT APC process for controlling a tuning process.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4A-4C illustrate a lot sampling process of the fabrication process of FIG. 3.

FIGS. 5A-5C illustrate a wafer sampling process of the of the fabrication process of FIG. 3.

DETAILED DESCRIPTION

The present disclosure relates generally to APC as applied to semiconductor fabrication and, more particularly, to system and method for implementing a wafer acceptance test ("WAT") APC with routing model.

It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Figure 1:
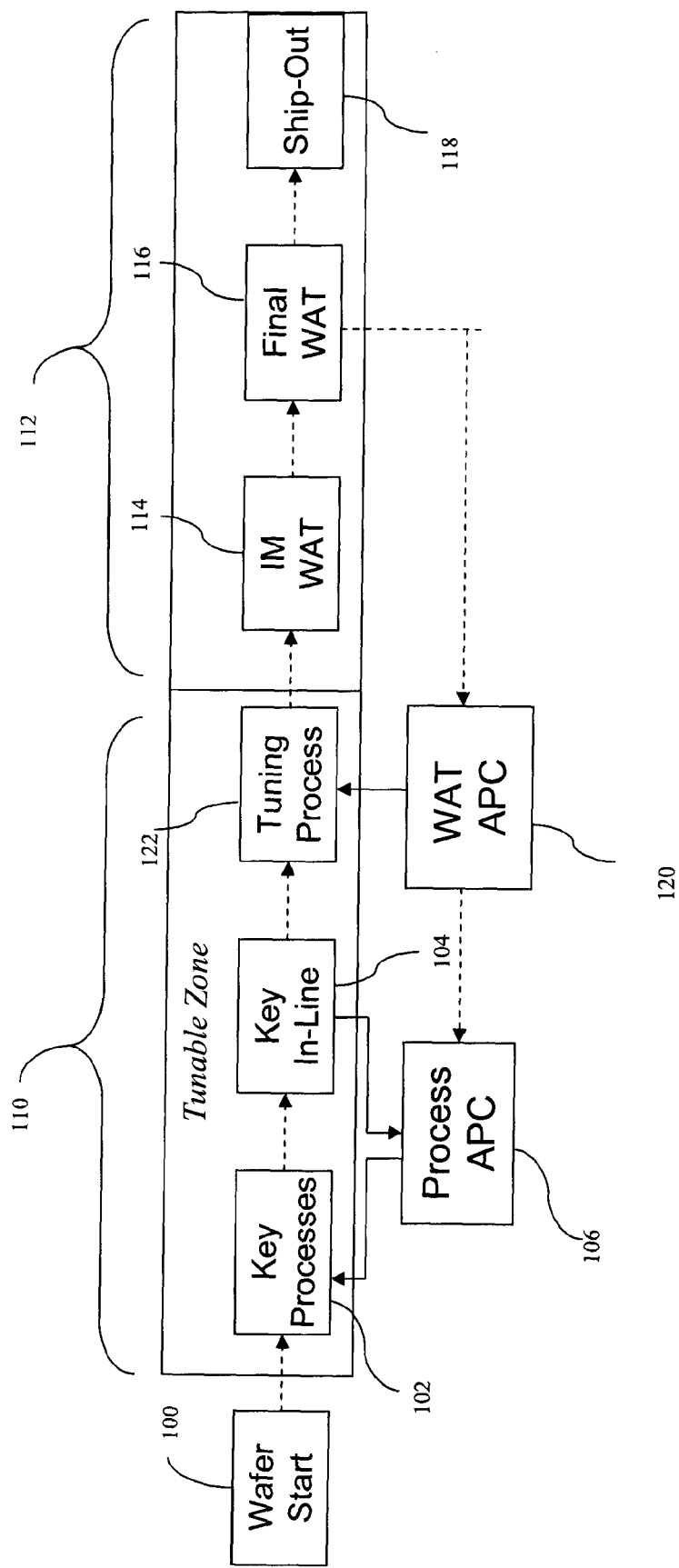
FIG. 1 is a block diagram illustrating a lifecycle of a lot of semiconductor wafers during a fabrication process in accordance with the prior art.

FIG. 1 illustrates a lifecycle of a lot of semiconductor wafers during a fabrication process in accordance with prior art. The process starts in a step 100. In step 102, a key process, which may comprise, for example, a photolithography process, an etching process, a deposition process, a chemical mechanical processing ("CMP") process, a coating process, a developing process, a thermal treatment process, or some other process, is performed on the wafers using appropriate process tools and/or computing devices, which may comprise processing, control, storage, display and/or input/output capabilities, as well as other equipment as necessary and appropriate to perform the respective functions thereof. In step 104, key in-line measurements on a sample (i.e., one or two wafers) of the wafer lot. It will be recognized that the measurements taken in step 104 are related to features created by the key process performed in step 102. For example, if the key process performed in step 102 is an etching process, then one of the key in-line measurements taken in step 104 may be a trench depth measurement. The key in-line measurements taken in step 104 are used to tune a process APC 106, which controls operation of the key process performed in step 102. In view of the fact that methods tuning an APC and using the APC to control a related process are well known to those having ordinary skill in the art, specific methods of accomplishing these tasks will not be discussed herein. It will be recognized that, while only one of each of the key process step 102, key inline measurements step 104, and process APC 106 are shown, multiple process steps and related measurement steps and APCs will likely be implemented during "front end" processing 110 of the wafers. During "back end" processing 112, in step 114, inter-metal ("IM") WAT is performed. Subsequently, and typically several weeks later, in step 116, final WAT is performed and each wafer that passes the final WAT undergoes post processing and is shipped out in step 118. Results of the final WAT step 116 are fed back to a WAT APC 120, which provides control signals to a tuning process step 122 and/or controller parameters about device electronic properties of a process APC 106. The tuning process step tunes the electrical properties of the subsequent wafers, for example, by performing an appropriate implant process to correct electrical properties of the wafer.

Figure 2:
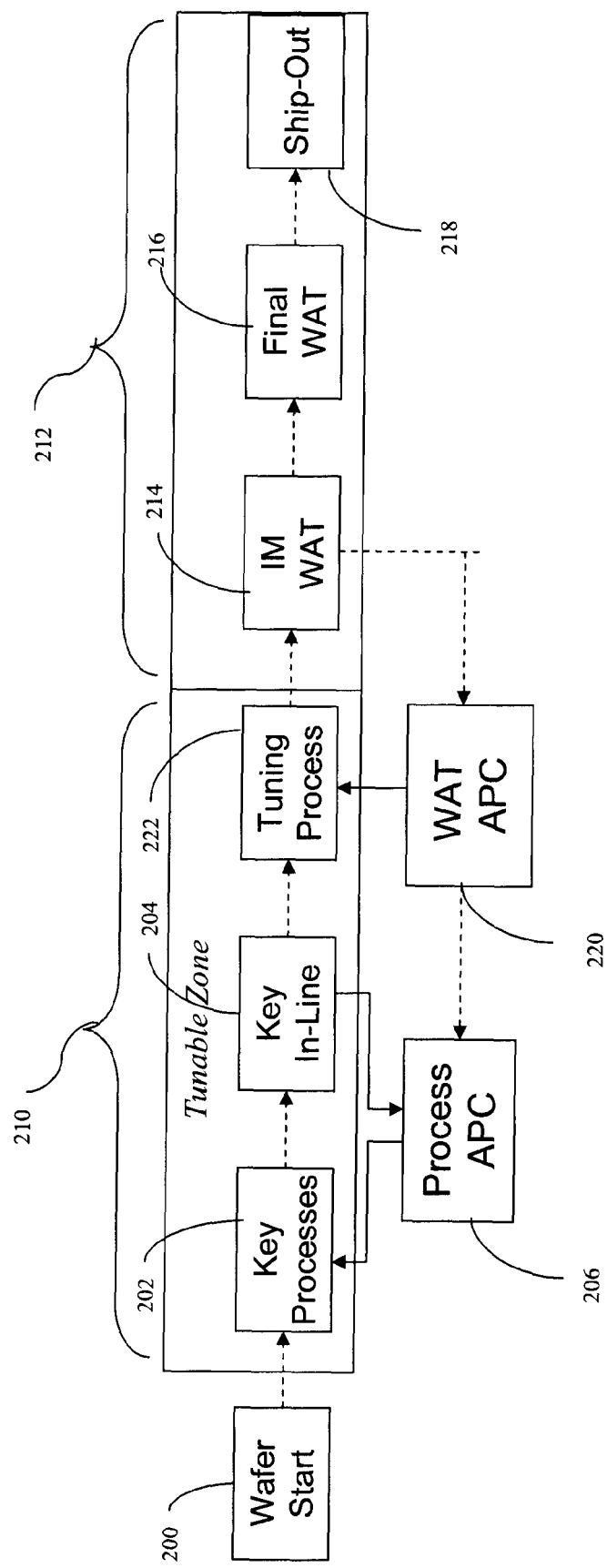
FIG. 2 is a block diagram illustrating a lifecycle of a lot of semiconductor wafers during a fabrication process in accordance with one embodiment.

FIG. 2 illustrates a lifecycle of a lot of semiconductor wafers during a fabrication process in accordance with a novel embodiment described herein. Similar to the process shown in FIG. 1, the process in FIG. 2 starts in a step 200. In step 202, a key process, which may comprise, for example, a photolithography process, an etching process, a deposition process, a chemical mechanical processing ("CMP") process, a coating process, a developing process, a thermal treatment process, or some other process, is performed on the wafers. In step 204, key in-line measurements on a sample (i.e., one or two wafers) of the wafer lot. It will be recognized that the measurements taken in step 204 are related to features created by the key process performed in step 202. For example, if the key process performed in step 202 is an etching process, then one of the key in-line measurements taken in step 204 may be a trench depth measurement. The key in-line measurements taken in step 204 are used to tune a process APC 206, which controls operation of the key process performed in step 202. In view of the fact that methods tuning an APC and using the APC to control a related process are well known to those having ordinary skill in the art, specific methods of accomplishing these tasks will not be discussed herein. It will be recognized that, while only one of each of the key process step 202, key inline measurements step 204, and process APC 206 are shown, multiple process steps and related measurement steps and APCs will likely be implemented during "front end" processing 210 of the wafers.

During "back end" processing 212, in step 214, inter-metal ("IM") WAT is performed. Subsequently, and typically several weeks later, in step 216, final WAT is performed and each wafer that passes the final WAT undergoes post processing and is shipped out in step 218. In accordance with features of one embodiment, as will be described in detail in connection with FIG. 3 et seq., rather than feeding the results of the final WAT step 216 back to the WAT APC 220 for use in tuning a tuning process 222 and/or a process APC 206, the results of the IM WAT step 214, which are available much sooner than the final WAT results, are used for this purpose.

Figure 3:
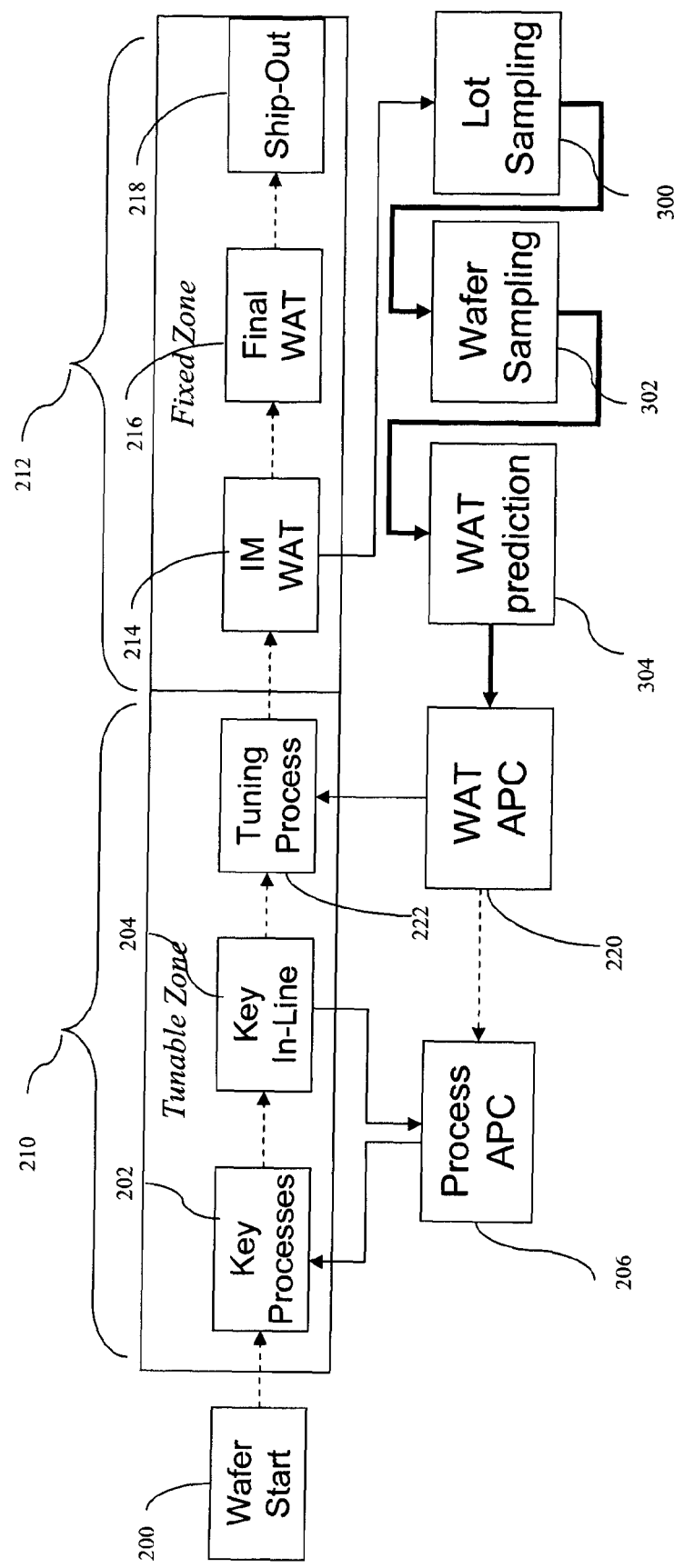
FIG. 3 is a more detailed block diagram illustrating a lifecycle of a lot of semiconductor wafers during the fabrication process shown in FIG. 2.

Referring now to FIG. 3, in accordance with features of embodiments described herein, results of the IM WAT step 214 are fed back to the WAT APC 220 via a lot sampling process 300, a wafer sampling process 302, and a WAT prediction process 304, each of which will be described in greater detail with reference to FIGS. 4A-4C, 5A-5C, and 6A-6B, respectively.

Figure 4A:
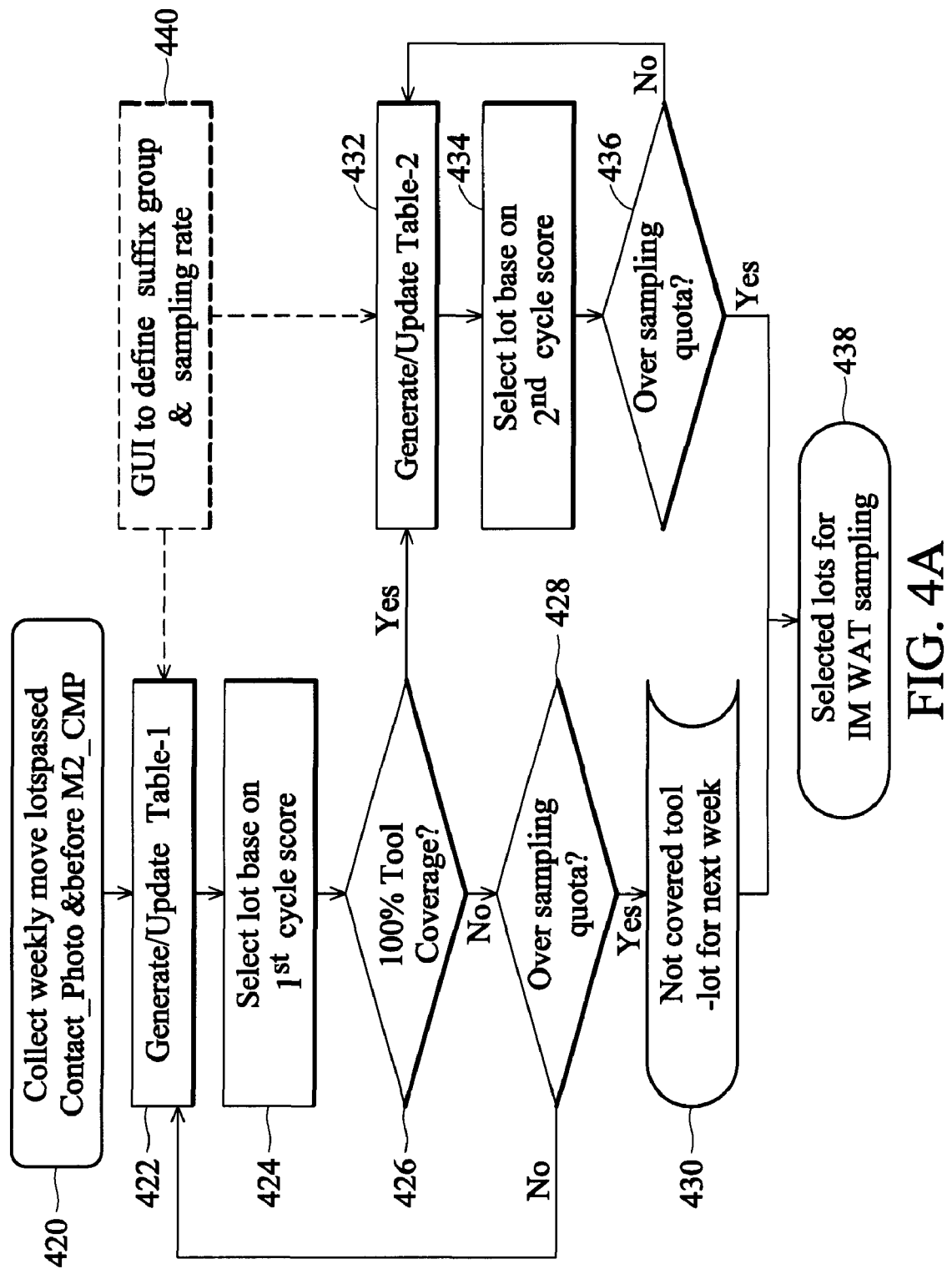

In particular, FIG. 4A is a flowchart of a method of performing the lot sampling process 300 (FIG. 3). In particular, the process 300 is used to select one or more lots for sampling in accordance with one embodiment. Referring to FIGS. 4B and 4C, the process 300 employs a first table 400 (FIG. 4B) comprising a chamber-lot matrix with processed lot count to prioritize lots for optimizing chamber coverage and a second table 402 (FIG. 4C) comprising chamber-lot matrix with sampled lot count to prioritize lots for optimizing sampling rate balance. In the first table 400, lots are prioritized according to a sum of chamber total moves for the most representative stages, or process steps. It will be recognized that each stage may be implemented by one of multiple process tools. In the second table 402, lots are prioritized to achieve a chamber sampling rate balance.

Returning to FIG. 4A, in step 420, weekly move lots that have passed a contact_photo process step but that have not passed an M2_CMP process step are collected and in step 422, the table 400 (FIG. 4B) is generated. In particular, each column of a first group of columns A, collectively designated in FIG. 4B by a reference numeral 404, represents a move lot, with each column being identified by a corresponding the lot number (i.e., L1-L15). The lots represented in the first group of columns A 404 are divided into two suffix groups 406A, 406B, although a greater number of suffix groups may be used. Each row in the table 400 corresponds to a tool for performing each of N stages. For example, as illustrated in the table 400, three tools (Tool-1, Tool-2, and Tool-3) are employed in stage 1; five tools (Tool-4 through Tool-8) are employed to perform stage 2, and so on.

A weekly total lot count for each tool is respectively entered in a column B, as designated by a reference numeral 408, for the tool. In particular, the weekly total lot count is the sum of all of the lots represented in the group of columns A 404 processed by the particular tool. For example, three lots (L1, L5, L9, and L14) were processed by Tool-1, so the entry in the column B 408 for Tool-1 is 4. A total number of lots from the previous week for each tool not covered that week is entered in a column C, as designated by a reference numeral 410. For example, Tool-1 was not covered in the previous week and the lot count for Tool-1 for that week was 3. A column D, as designated by a reference numeral 411 indicates whether the corresponding tool has been sampled, with a 0 indicating the tool has not been sampled and a 1 indicating that it has. A final row 412 indicates a cycle-1 score for the corresponding lot. The cycle-1 score for each lot is calculated by scoring each tool N using the following equation:

$$\text{Tool Score}_N = A_N * (B_N + C_N) * (1 - D_N)$$

and then summing all of the tool scores for the lot. For example, using lot L1, the tool score for Tool-1 is 1*(4+3)*(1−0) or 7; the tool score for Tool-4 is 1*(2+1)*(1−0) or 3; the tool score for Tool-N is 1*(6+4)*(1−0) or 10. It will be noted that the tool scores for the remaining tools will be 0, as A=0 for each of those tools. Therefore, the cycle-1 score for lot L1 is the sum of the tool scores; i.e., 7+3+10 or 20. Once the tool scores have been calculated for each of the lots, in step 424, a lot with the highest cycle-1 score is selected. It will be noted that if two or more lots have the same cycle-1 score, the lot processed earlier will be selected. From the table 400, the lot L4 is selected. In step 426, a determination is made whether 100% tool coverage has been achieved. If not, execution proceeds to step 428 in which a determination is made whether an over-sampling quota has been met. If not, execution returns to step 422 and the first table is updated to remove the selected lot (in this case, lot L4) and the value in column D 411 for each of the tools used to process lot L4 (Tool-2, Tool-5, and Tool-N) will be set to 1 to indicate that the tool has been sampled. It should be noted that each time the step 422 is executed, a lot in the next suffix group should be selected to balance the sampling rate for all groups. This loop continues until there is either 100% tool coverage in step 426 or the over-sampling quota is met in step 428. Once the over-sampling quota is met in step 428, in step 430, the weekly total lot count for all tools that were not covered is saved for inclusion in the first table for the following week.

If in step 426, 100% tool coverage has been achieved (as indicated by all of the values in column D 411 being set to 1), in step 432, the second table 402 (FIG. 4C) is generated. The second table 402 is identical to the most recently updated version of the first table 400, except that (1) the entry in column D 411 for each of the tools is 1 instead of 0; and (2) instead of including a cycle-1 score for each lot L1-L15, the table 402 includes a cycle-2 score for each of the lots in a row 414. The cycle-2 score for each lot is calculated by scoring each tool N using the following equation:

$$\text{Tool Score}_N = A_N * D_N / (B_N + C_N)$$

and then summing all of the tool scores for the lot. For example, using lot L1, the tool score for Tool-1 is 1*1/(4+3) or 0.143; the tool score for Tool-4 is 1*1/(2+1) or 0.333; the tool score for Tool-N is 1*1/(6+4) or 0.1. It will be noted that the tool scores for the remaining tools will be 0, as A=0 for each of those tools. Therefore, the cycle-2 score for lot L1 is the sum of the tool scores; i.e., 0.143+0.333+0.1 or 0.576. Once the tool scores have been calculated for each of the lots in step 432 and the second table 402 has been generated, the lot with the lowest cycle-2 score is selected in step 434. It will be noted that if two or more lots have the same cycle-2 score, the lot processed earlier will be selected.

In step 436, a determination whether the over-sampling quota has been met. If not, execution returns to step 432 and the table 402 is updated by removing the selected lot. This loop is repeated until the over-sampling quota is met in step 436. It should be noted that each time the step 432 is executed, a lot in the next suffix group should be selected to balance the sampling rate for all groups. Upon completion of steps 430 or 436, execution proceeds to step 438, in which the lots selected in steps 424 and 434 are used for wafer sampling and WAT prediction as described hereinbelow. It will be noted that in an optional step 440, a GUI may be provided for enabling a user to define suffix groups and sampling rates, including over-sampling quotas, for the lots for use in connection with the generation and updating of the tables 400, 402, in steps 422, 432, respectively.

Figure 5A:
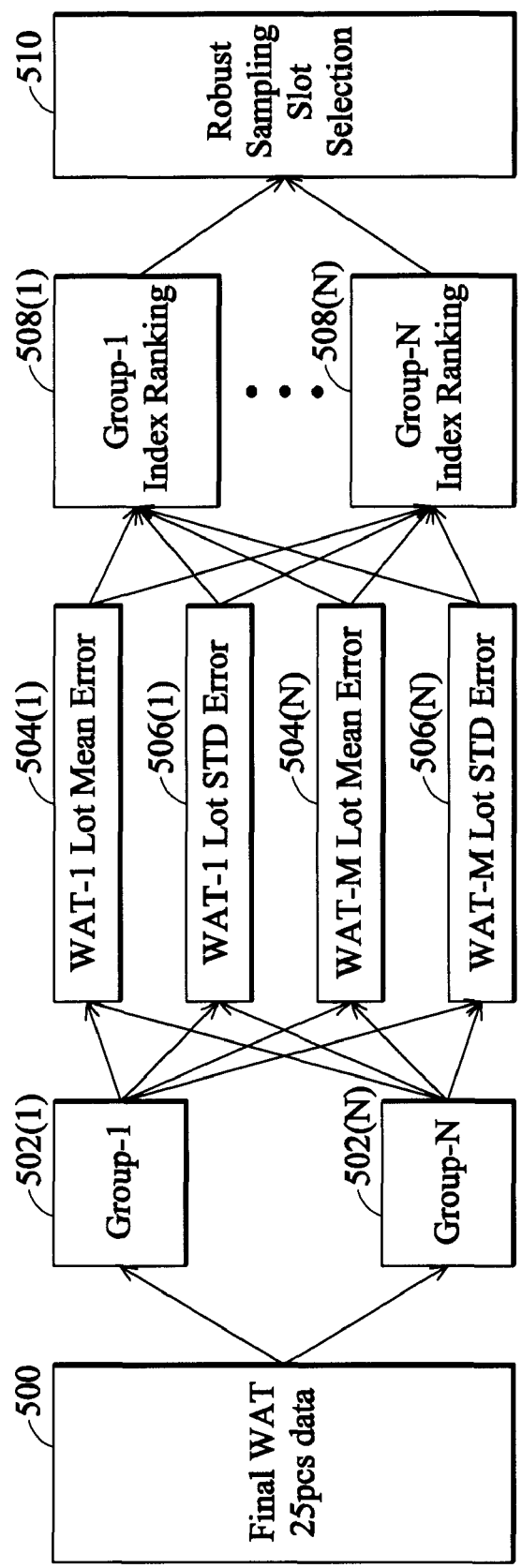

FIGS. 5A-5C illustrate the wafer sampling process 302 of the process of FIG. 3. It will be recognized that the process is performed for each of the lots selected in the process illustrated in FIGS. 4A-4C. Referring first to FIG. 5A, in block 500, the final WAT data for one of the selected lots is accumulated and then divided into groups of three wafers each, as represented by blocks 502(1)-502(N). Next, a lot mean error ("Lot_Mean_Error") is calculated for each of the groups 502 (1)-502(N), as represented by blocks 504(1)-504(N), using an equation 550 shown in FIG. 5B. Additionally, standard error values ("STD_Error") are calculated for each of the groups 502(1)-502(N), as represented by blocks 506(1)-506(N), using an equation 552 shown in FIG. 5B. Next, an index (Index$_x$) is calculated for each of the groups using an equation 554 shown in FIG. 5B and the groups are ranked by index, as represented in FIG. 5A by blocks 508(1)-508(N). In the equation 554, $w_1$-$w_4$ represent weights selected based on past experience. $A_x$ represents a PMOS mean error for the group, $A_a$ represents the lot mean error, and $A_s$ represents the standard error. $B_x$ represents a PMOS standard error for the group, $B_a$ represents the lot mean error, and $B_s$ represents the standard error. $C_x$ represents an NMOS mean error for the group, $C_a$ represents the lot mean error, and $C_s$ represents the standard error. Finally, $D_x$ represents an NMOS standard error for the group, $C_a$ represents the lot mean error, and $D_s$ represents the standard error.

FIG. 5C illustrates a table 560, which includes mean error, standard error, and index data for three months (May, June, and July) for each of three wafer groups ([6][13][18], [6][11][22], and [6][7][23]). In step 510 (FIG. 5A), a robust sampling slot selection is performed. Generally, this consists of selecting the wafer group with the highest index as the sample wafer group for use in performing the WAT prediction process described below. Although a new group may be picked each month based on the preceding month's data, it is anticipated that, so long as a group's index remains sufficiently high, the group will be maintained as the sample wafer group.

Figure 6A:
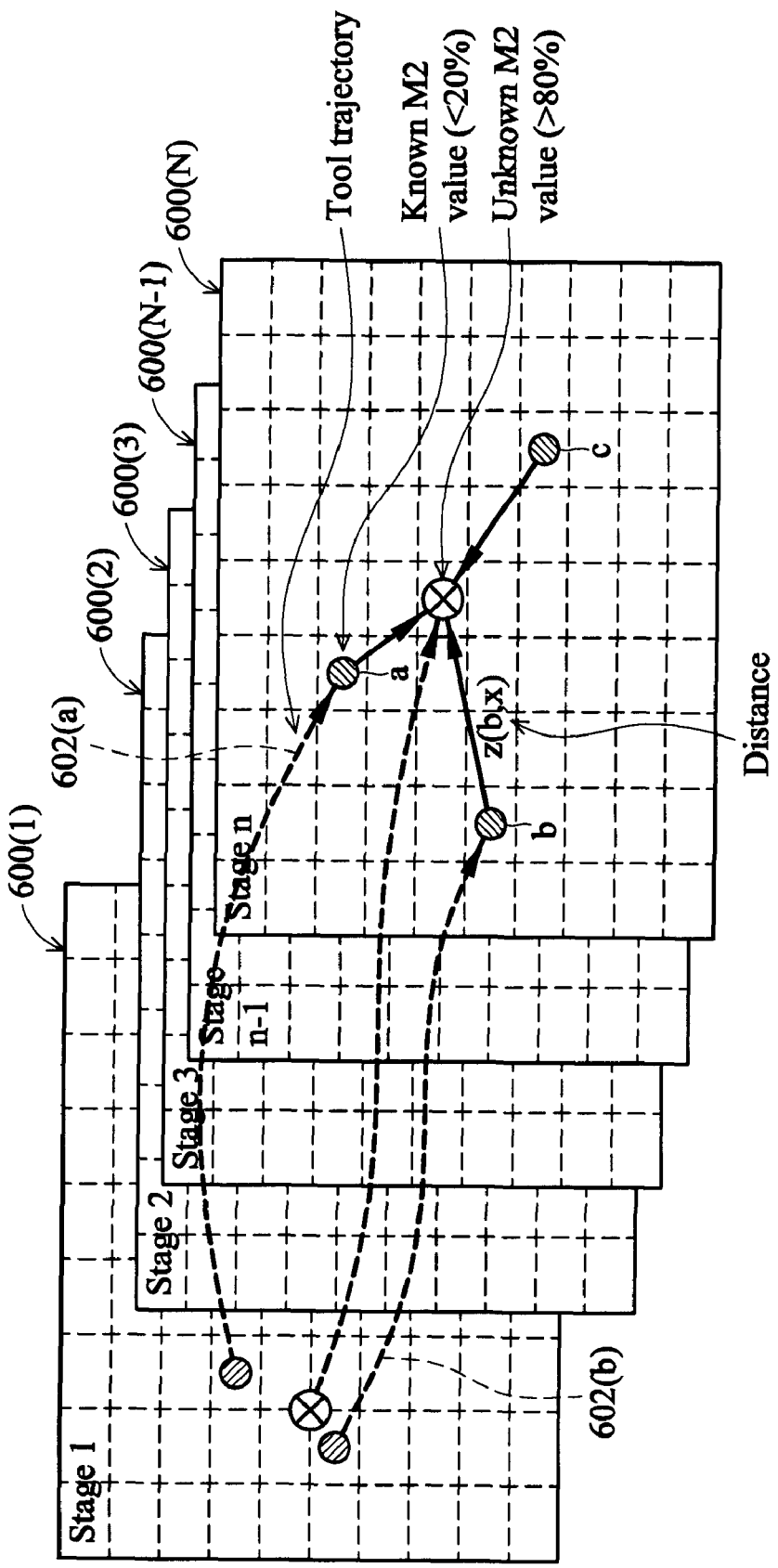
FIGS. 6A-6B illustrate a WAT prediction process of the of the fabrication process of FIG. 3.
Figure 6B:
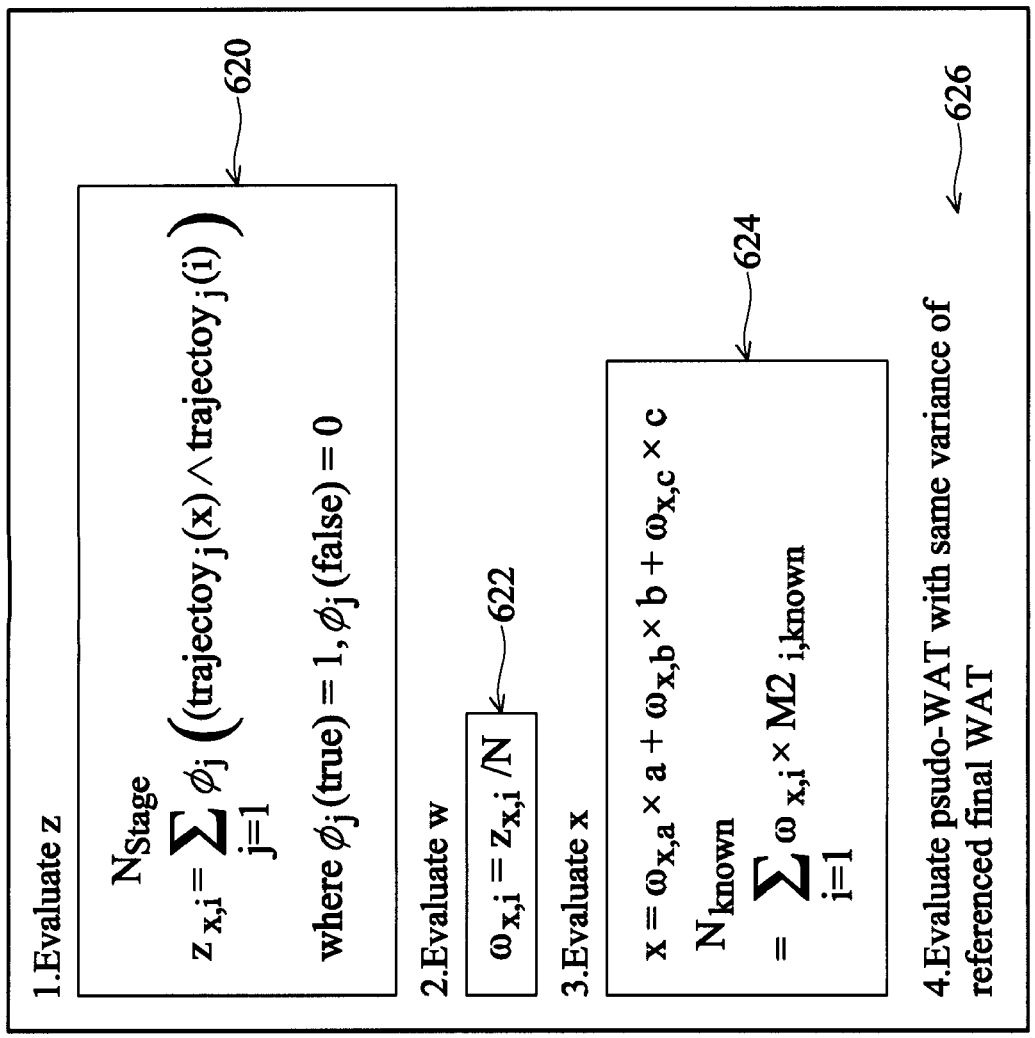

FIGS. 6A-6B illustrate the WAT prediction process 304. It will be recognized that, while final WAT is performed for all wafers of a lot, IM WAT is performed for only a sample number of such wafers; therefore, the WAT prediction process 304 models final WAT for all wafers of the lot based on the IM WAT data for the sample wafers of the lot based on routing of the wafers. Referring to FIG. 6A, each of grids 600(1)-600(N) represents one of N wafer processing stages. Referring for the sake of example to the grid 600(N) point a represents sample IM WAT data for a sample wafer a for the stage N. Similarly, points b and c each represent sample IM WAT data for sample wafers b and c, respectively, for the stage N. It will be recognized that, although not shown, a data point a exists on each of the grids 600(1)-600(N-1) representing respective sample IM WAT data for wafer 1 for each of those stages, respectively. The same is true for IM WAT data for wafers b and c. Using wafer a as an example, a line 602(a) thorough the points a on all of the grids 600(1)-600(N) represents a tool trajectory for the wafer a. Similarly, lines 602(b), 602(c), through the points b and c, respectively, on all of the grids 600(1)-600(N) represent tool trajectories of the wafers b and c. It will be recognized that two wafers that have identical tool trajectories should have identical properties/IM WAT data. A point x on the grid 600(N) represents an unknown data value that must be predicted from the data for wafers a, b, and c.

Referring now to FIG. 6B, the data illustrated in FIG. 6A is evaluated as follows. In a step 620, a distance z between x and each of a, b, and c, respectively, at each stage is calculated using the equation 620. For example, using the data for wafer a as an example, in the equation 620, for each stage that the trajectory of point x intersects with that of wafer a, the value of $\Phi$ at that stage will be true, otherwise, the value of $\Phi$ at that stage will be false. Accordingly, $z_{x,a}$ represents the number of stages at which the trajectories of x and a intersect. Next, an equation 622 is applied to determine a weight $\omega_{x,i}$ for each wafer. In particular, the value for $z_{x,a}$ determined using the equation 620 is divided by the number of stages to normalize the value. Next, an equation 624 is used to determine WAT data for wafer x. Finally, a known bias is applied to the estimated WAT data for x determined in step 622 to more closely approximate the actual final WAT data for the wafer. The adjusted WAT data may then be used by the WAT APC 220 in the same manner as the final WAT data is used by the WAT APC 120 in the prior art embodiment illustrated in FIG. 1.

Although only a few exemplary embodiments of this invention have been described in detail above, those skilled in the art will readily appreciate that many modifications are possible in the exemplary embodiments without materially departing from the novel teachings and advantages of this invention.

It is understood that various different combinations of the above-listed embodiments and steps can be used in various sequences or in parallel, and there is no particular step that is critical or required. Moreover, each of the processes depicted in the drawings can be implemented on multiple devices, including computing devices, and implementation of multiple ones of the depicted modules may be combined into a single device, including a computing device. Furthermore, features illustrated and discussed above with respect to some embodiments can be combined with features illustrated and discussed above with respect to other embodiments. Accordingly, all such modifications are intended to be included within the scope of this invention.

What is claimed is:

1. A method for implementing wafer acceptance test ("WAT") advanced process control ("APC"), the method being implemented by a computer and comprising:
    performing an inter-metal ("IM") WAT on a plurality of processed wafer lots;

selecting, by the computer, a subset of the plurality of wafer lots using a lot sampling process, wherein the selecting the subset of the plurality of wafer lots comprises prioritizing lots according to a sum of chamber total moves for key stages used in processing the lots and selecting lots to provide maximum tool coverage from the prioritized lots;

selecting, by the computer, a sample wafer group using the wafer lot subset, wherein IM WAT is performed on wafers of the sample wafer group to obtain IM WAT data therefrom;

estimating, by the computer, final WAT data for all wafers in the processed wafer lots from IM WAT data obtained for the sample wafer group; and automatically providing, by the computer, the estimated final WAT data to a WAT APC process, the WAT APC process using the estimated final WAT data to control a tuning process or a process APC process.

2. The method of claim 1 wherein the selecting a subset of the plurality of wafer lots further comprises prioritizing lots to achieve chamber sampling rate balance and selecting lots to provide maximum tool coverage from the prioritized lots.

3. The method of claim 1 wherein the selecting a sample wafer group comprises selecting a group of three wafers most representative of the lot of wafers as a whole.

4. The method of claim 1 wherein the estimating final WAT data comprises evaluating a trajectory of an unknown wafer through multiple process stages against trajectories of each of the wafers in the sample group of wafers to determine commonalities therebetween.

5. The method of claim 4 wherein the estimating final WAT data comprises adding a bias value to estimated IM WAT data for the unknown wafer to determine the final WAT data.

6. A system for implementing wafer acceptance test ("WAT") advanced process control ("APC"), the system comprising:

means for performing an inter-metal ("IM") WAT on a plurality of processed wafer lots;

means for selecting a subset of the plurality of wafer lots using a lot sampling process, wherein the means for selecting the subset of the plurality of wafer lots comprises means for prioritizing lots to achieve chamber sampling rate balance and means for selecting lots to provide maximum tool coverage from the prioritized lots;

means for selecting a sample wafer group using the wafer lot subset, wherein IM WAT is performed on wafers of the sample wafer group to obtain IM WAT data therefrom;

means for estimating final WAT data for all wafers in the processed wafer lots from IM WAT data obtained for the sample wafer group; and means for automatically providing the estimated final WAT data to a WAT APC process, the WAT APC process using the estimated final WAT data to control a tuning process.

7. The system of claim 6 wherein the means for selecting a subset of the plurality of wafer lots further comprises means for prioritizing lots according to a sum of chamber total move for key stages and the means for selecting lots to provide maximum tool coverage from the prioritized lots.

8. The system of claim 6 wherein the means for selecting a sample wafer group comprises means for selecting a group of three wafers most representative of the lot of wafers as a whole.

9. The system of claim 6 wherein the means for estimating final WAT data comprises evaluating a trajectory of an unknown wafer through multiple process stages against trajectories of each of the wafers in the sample group of wafers to determine commonalities therebetween.

10. The system of claim 6 wherein the estimating final WAT data comprises adding a bias value to estimated IM WAT data for the unknown wafer to determine the final WAT data.

11. A system for implementing wafer acceptance test ("WAT") advanced process control ("APC"), the system comprising:

an inter-metal ("IM") WAT module for performing an IM WAT on a plurality of processed wafer lots;

a lot sampling module for selecting a subset of the plurality of wafer lots using a lot sampling process, wherein the lot sampling process comprises prioritizing lots according to a sum of chamber total move for key stages used in processing the lots and selecting lots to provide maximum tool coverage from the prioritized lots;

a wafer sampling module for selecting a sample wafer group by applying a wafer sampling process to the wafer lot subset, wherein IM WAT is performed on wafers of the sample wafer group to obtain IM WAT data therefrom;

a WAT prediction module for estimating final WAT data for all wafers in the processed wafer lots from IM WAT data obtained for the sample wafer group; and a WAT APC module for automatically receiving the estimated final WAT data and using the received data to control a tuning process or a process APC process.

12. The system of claim 11 wherein the lot sampling process further comprises prioritizing lots to achieve chamber sampling rate balance and selecting lots to provide maximum tool coverage from the prioritized lots.

13. The system of claim 11 wherein wafer sampling process comprises selecting a group of three wafers most representative of the lot of wafers as a whole.

14. The system of claim 11 wherein the estimating final WAT data comprises adding a bias value to estimated IM WAT data for the unknown wafer to determine the final WAT data.

* * * * *